(12) United States Patent
Doornbos et al.

(10) Patent No.: US 8,994,112 B2
(45) Date of Patent: Mar. 31, 2015

(54) FIN FIELD EFFECT TRANSISTOR (FINFET)

(75) Inventors: Gerben Doornbos, Redhill (GB); Robert Lander, Leuven (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 388 days.

(21) Appl. No.: 13/063,504

(22) PCT Filed: Sep. 10, 2009

(86) PCT No.: PCT/IB2009/053963
§ 371 (c)(1),
(2), (4) Date: Mar. 17, 2011

(87) PCT Pub. No.: WO2010/032174
PCT Pub. Date: Mar. 25, 2010

(65) Prior Publication Data
US 2011/0169101 A1      Jul. 14, 2011

(30) Foreign Application Priority Data

Sep. 16, 2008   (EP) .................................... 08105356

(51) Int. Cl.
*H01L 21/70*     (2006.01)
*H01L 29/78*     (2006.01)
*H01L 29/66*     (2006.01)

(52) U.S. Cl.
CPC ...... *H01L 29/7851* (2013.01); *H01L 29/66795* (2013.01); *H01L 29/7853* (2013.01); *H01L 29/7854* (2013.01)
USPC ........... 257/368; 257/330; 257/365; 257/401; 257/E29.309; 257/E21.09; 438/154; 438/184; 438/197; 438/221

(58) Field of Classification Search
USPC ................. 257/213, 288, 401, 330, 365, 368, 257/E29.039, E21.09; 438/154, 184, 197, 438/221
See application file for complete search history.

(56) References Cited

U.S. PATENT DOCUMENTS

| | | | |
|---|---|---|---|
| 2004/0104436 A1* | 6/2004 | Walker et al. | 257/355 |
| 2005/0073022 A1* | 4/2005 | Karlsson et al. | 257/510 |
| 2005/0280102 A1* | 12/2005 | Oh et al. | 257/401 |
| 2007/0128782 A1* | 6/2007 | Liu et al. | 438/187 |
| 2007/0133273 A1* | 6/2007 | Liao et al. | 365/175 |
| 2007/0228425 A1* | 10/2007 | Miller et al. | 257/288 |
| 2009/0001415 A1* | 1/2009 | Lindert et al. | 257/190 |

* cited by examiner

*Primary Examiner* — Su C Kim
(74) *Attorney, Agent, or Firm* — McClure, Qualey & Rodack, LLP

(57) ABSTRACT

A Fin FET whose fin (12) has an upper portion (30) doped with a first conductivity type and a lower portion (32) doped with a second conductivity type, wherein the junction (34) between the upper portion (30) and the lower portion (32) acts as a diode; and the FinFET further comprises: at least one layer (26, 28) of high-k dielectric material (for example $Si_3N_4$) adjacent at least one side of the fin (12) for redistributing a potential drop more evenly over the diode, compared to if the at least one layer of high-k dielectric material were not present, when the upper portion (30) is connected to a first potential and the lower portion (32) is connected to a second potential thereby providing the potential drop across the junction (34). Examples of the k value for the high-k dielectric material are $k \geq 5$, $k \geq 7.5$, and $k \geq 20$.

14 Claims, 8 Drawing Sheets

FIN FIELD EFFECT TRANSISTOR (FINFET)

CROSS-REFERENCE TO RELATED APPLICATION

This application is a co-pending application which claims priority to PCT Application No. PCT/IB2009/053963, filed Sep. 10, 2009, entitled "Fin Field Effect Transistor (FIN-FET)," which claims priority to European Patent Application No. 08105356.3, filed on Sep. 16, 2008 each of these applications being incorporated herein by reference in their entirety.

The present invention relates to Fin Field Effect transistors (FinFETs) and the fabrication thereof. The present invention is particularly suited to FinFETs fabricated on bulk silicon wafers typically used for fabricating planar bulk FETs.

A FinFET is a field effect transistor which has a narrow, active area of a semiconductor material protruding from a substrate so as to resemble a fin. The fin includes source and drain regions. Active areas of the fin are separated by shallow trench isolation (STI), typically $SiO_2$. The FinFET also includes a gate region located between the source and the drain regions. The gate region is formed on a top surface and sidewalls of the fin such that it wraps around the fin. The portion of the fin extending under the gate between the source region and the drain region is the channel region.

FinFETs are regarded as main candidates to replace conventional planar bulk MOSFETs in advanced (beyond 32 nm node) CMOS thanks to their good gate control over the channel, resulting in improved short-channel effect immunity and $I_{on}/I_{off}$ ratio.

One type of FinFET is fabricated on silicon on insulator (SOI) wafers. One advantage of SOI FinFETs is that they have low leakage current from source to drain because there is an oxide layer below the fin which blocks the leakage current.

Another type of FinFET is fabricated on conventional bulk silicon wafers. These FinFETs are known as bulk FinFETs. Fabricating FinFETs on conventional bulk Si wafers can be considered advantageous for two reasons: (i) the lower cost of bulk wafers and (ii) the option to co-integrate conventional planar bulk FETs and FinFETs in a single product.

In FinFETs, the source and the drain region are heavily doped. The source and the drain regions each have a first conductivity type (n-type for NMOS and p-type for PMOS). A problem with existing bulk FinFETs is that a leakage path from source to drain exists through the part of the fin which is not controlled by the gate, i.e. the portion of the fin below the gate and adjacent to the STI. The leakage from source to drain through the lower part of the fin is known as punch-through leakage. Punch-through leakage causes an increase of static power consumption which is undesirable.

In order to solve the problem of punch-through leakage in bulk FinFETs, a lower portion of the fin is doped to have a conductivity type opposite the conductivity type of the source and drain regions (p-type for NMOS; n-type for PMOS). The punch-though-stopper (PTS) dopant is implanted in the part of the fin directly below the channel and below the source and drain regions.

A result of PTS doping, however, is that, in both the source region and the drain region of the fin, there is an abrupt junction between the upper part of the fin of the first conductivity type and the lower part of the fin of the second and opposite conductivity type. The junction effectively operates as a diode located between: the source region and the substrate; and the drain region and the substrate, respectively.

In digital circuits NMOS substrates are biased to zero volts, and the source and drain potentials vary between zero and the supply voltage $V_{dd}$. The same holds for PMOS, in which the situation is complementary. Thus the diodes are either unbiased or reverse-biased in CMOS circuit application.

When the N++/P+ (NMOS) or P++/N+ (PMOS) diodes are reverse biased there is a high electric field across the very abrupt n/p junction. As a result of the high electric field, the conduction and valence bands of the n-type and p-type semiconductors are sharply bent and electrons can tunnel from valence band (leaving a hole behind) to conduction band or vice versa. This tunneling can be pure quantum mechanical, or thermally assisted, or trap-assisted. In the latter case the leakage is enhanced by structural damage in the diode, often generated by the implantation process. The effect is known as known as band-to-band tunneling (BTBT). Band to-band tunneling results in a leakage current across the reverse-biased N++/P+ (NMOS) or P++/N+ (PMOS) diodes rendering bulk FinFETs unattractive for low standby power application.

To optimize the leakage of a bulk FinFET, the optimum PTS doping level is determined by a trade-off between punch-through from source to drain (which demands high doping) and band-to-band tunneling from source/drain to substrate (which demands low doping).

US2006/0118876 A1 discloses a bulk FinFET in which a layers of silicon nitride and oxides are positioned adjacent the source and drain regions of the fin.

US 2008/0048262 A1 discloses a FinFET in which the source/drain portions of a fin are coated with an etch stop layer of silicon nitride.

The present inventors have realized it would be desirable to reduce the leakage due to band-to-band tunneling.

The present inventors have also realized it would be desirable to improve the trade-off between punch-through (which demands high doping) and band-to-band tunneling (which demands low doping).

In a first aspect, the present invention provides a FinFET comprising: a semiconductor substrate with a fin; the fin having an upper portion and a lower portion, the upper portion being doped with a dopant of a first conductivity type, the lower portion being doped with a dopant of a second conductivity type, wherein the junction between the upper portion and the lower portion acts as a diode. The FinFET further comprises: at least one layer of high-k dielectric material adjacent to at least one side of the fin for redistributing a potential drop more evenly over the diode, compared to if the at least one layer of high-k dielectric material were not present, when the upper portion is connected to a first potential and the lower portion is connected to a second potential thereby providing the potential drop across the junction.

The at least one layer of high-k dielectric material may have a k value of k≥5.

The at least one layer of high-k dielectric material may have a k value of k≥7.5.

The at least one layer of high-k dielectric material may have a k value of k≥20.

The at least one layer (26, 28) of high-k dielectric material may be $HfO_2$.

The at least one layer of high-k dielectric material adjacent at least one side of the fin may comprise a layer of dielectric material provided adjacent opposite sides of the fin.

The FinFET may further comprise a shallow trench isolation layer provided above the substrate and adjacent the layer of high-k dielectric material.

The fin may further comprise a source and a drain separated by a channel region, the channel region of the fin being surrounded by a gate region on three sides.

The FinFET may further comprise a punch through stopper layer provided in the lower portion of the fin below the channel region.

In a further aspect the present invention comprises a method of fabricating a FinFET, the method including the steps of: providing a semiconductor substrate; etching the substrate to provide a fin; depositing a layer of high-k dielectric material adjacent at least one side of the fin; depositing a shallow trench isolation layer above the substrate and adjacent the layer of high-k dielectric material; providing a gate region on top of and around the sides of the fin; and implanting dopants in the fin to form the active semiconductor areas.

The step of implanting dopants may comprise heavily doping an upper portion and a lower portion of the fin, the upper portion being doped with a dopant of a first conductivity type, the lower portion being doped with a dopant of a second conductivity type, wherein the junction between the upper portion and the lower portion acts as a diode; and wherein the step of depositing a layer of high-k material comprises depositing at least one layer of high-k dielectric material adjacent at least one side of the fin for redistributing a potential drop more evenly over the diode, compared to if the at least one layer of high-k dielectric material were not present, when the upper portion is connected to a first potential and the lower portion is connected to a second potential thereby providing the potential drop across the junction.

The step of depositing a layer of high-k dielectric material may comprise depositing a layer of high-k dielectric material with a k value of k≥5.

The step of depositing a layer of high-k dielectric material may comprise depositing a layer of high-k dielectric material with a k value of k≥7.5.

The step of depositing a layer of high-k dielectric material may comprise depositing a layer of high-k dielectric material with a k value of k≥20.

The step of depositing a layer of high-k dielectric material adjacent at least one side of the fin may comprise depositing a layer of high-k dielectric material adjacent opposite sides of the fin.

Embodiments of the present invention will now be described, by way of example, with reference to the accompanying drawings, in which.

Figure 1:
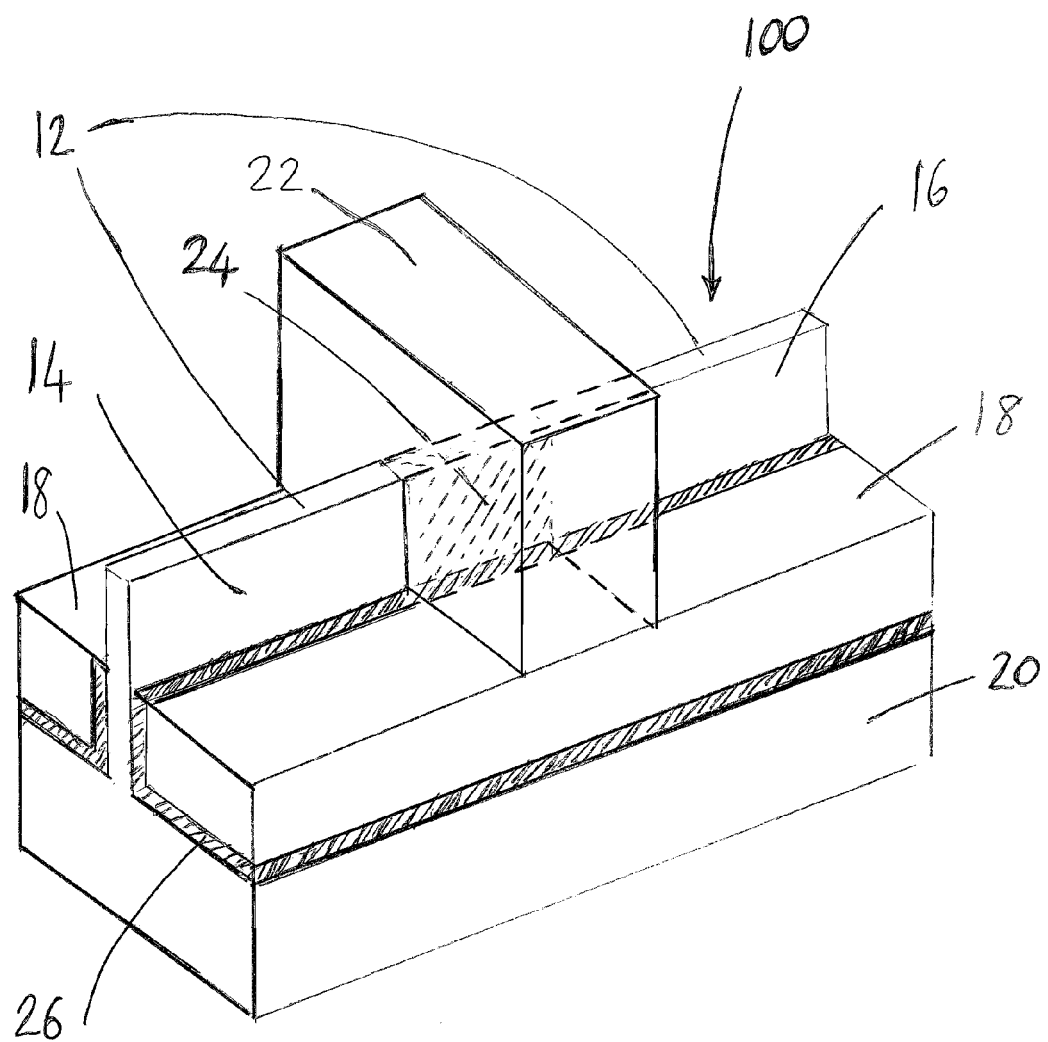
FIG. 1 is a schematic view (not to scale) of a first embodiment of a bulk FinFET.

FIG. 1 is a schematic view (not to scale) of a first embodiment of a bulk FinFET 100. The FinFET 100 comprises a substrate 20 of silicon. The FinFET 100 includes a narrow rectangular fin 12. Fins are typically between 10 nm and 30 nm wide. In this embodiment the fin 12 is approximately 20 nm wide. The fin 12 protrudes from the substrate 20 in a direction perpendicular to the plane of the substrate 20. The active top part of the fin 12 is 50 nm high (typically for fins this is 40-60 nm). The bottom part of the fin 12 is approximately 200 nm high. The fin 12 includes a source region 14 and a drain region 16. The source and drain regions 14, 16 of the fin 12 are separated by a layer 18 of $SiO_2$, known as the shallow trench isolation or the STI 18. In this embodiment the STI 18 has a thickness of approximately 250 nm. Between the STI 18 and the fin there is a 10 nm wide layer 26 of $HfO_2$ (a high-k dielectric material) which extends along the length of the lower portion of the fin 12. The $HfO_2$ has a typical k value of k=21. The high-k dielectric layer 26 also extends between the substrate 20 and the STI 18. The high-k dielectric layer 26, which is not present in known FinFETs, will be described in more detail with reference to FIG. 2.

A gate region 22 is located between the source region 14 and the drain region 16. The gate region 22 is located on top of the STI 18. The gate region 22 extends over and across the fin 12. The fin 12 also comprises a channel region 24 located between the source region 14 and the drain region 16 and under the gate region 22. As is shown in FIG. 1 the gate region 22 wraps around the fin 12 from three sides. As a result the gate 22 has excellent electrostatic control over the channel region 24 of the fin 12.

Figure 2:
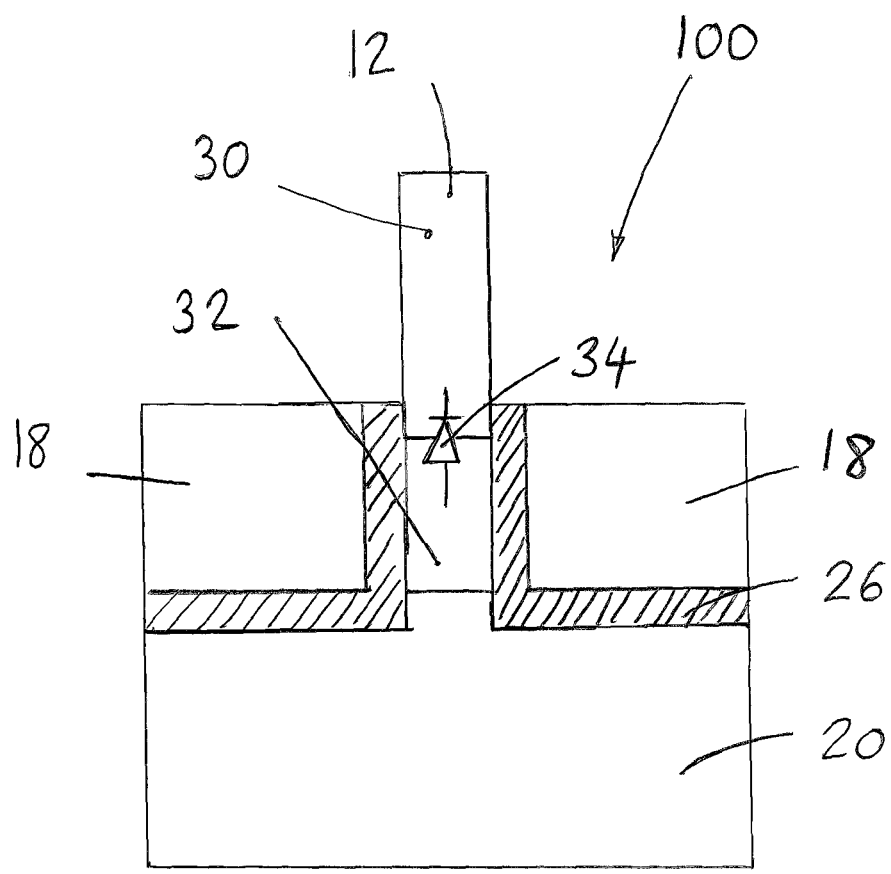
FIG. 2 is a schematic illustration (not to scale) of a cross-section taken through the fin outside the gate of the bulk NMOS FinFET of FIG. 1.

The FinFET 100 illustrated in FIGS. 1 and 2 is an NMOS FET. The source region 14 and the drain region 16 of the fin 12 are heavily doped with n-type semiconductor dopants. The channel region 24 is located between the source 14 and the drain 16 regions of the fin 12 in the upper portion of the fin 12. The channel region 24 can be undoped or lightly doped.

As explained above, a problem with known bulk FinFETs is that at high bias voltages FinFETs suffer from punch-through leakage. In known bulk FinFETs, a leakage path exists from the source region to the drain region through the part of the fin which is not controlled by the gate, i.e. the portion of the fin adjacent to the STI and below the channel region.

FIG. 2 is a schematic illustration (not to scale) of a cross-section taken through the fin outside the gate i.e. through the source 14 or drain 16 of the bulk NMOS FinFET 100 of FIG. 1.

In order to eliminate the leakage current occurring in known bulk FinFETs caused by punch through between the source and the drain regions, the fin 12 of the FinFET 100 is subdivided into two portions 30, 32.

The upper portion 30 of the source and the drain regions 14, 16 is highly doped by an ion implantation process with n-type dopant. A p-type punch-through stopper (PTS) dopant is implanted in the lower portion 32 of the fin 12 directly below the channel region 24.

The subdivision of the fin 12 into oppositely doped upper and lower portions 30, 32, however, causes an abrupt n/p junction 34 to be formed between each of the source 14 and drain regions 16 and the lower portion 32 of the fin. As is shown schematically in FIG. 2, the abrupt n/p junction 34 is located slightly below the surface level of the STI 18.

The purpose of oppositely doping the upper and lower portions 30, 32 of the fin 12 is that the junction 34 between the differently doped portions of the fin 12 inhibits leakage current between the source 14 and drain 16.

A disadvantageous effect of the highly abrupt n/p junction 34, however, is that the junction 34 acts as a diode, as shown schematically in FIG. 2.

As explained above, the abruptness of the junctions formed between the source and drain regions 14, 16 and the lower portion 32 of the fin 12 leads to leakage currents formed by band-to-band tunneling (BTBT). Although BTBT could be reduced by lowering the doping levels in the source and drain regions 14, 16, this step would also lead to series resistance between source/drain and channel, while reducing the punch-through stopper dose would reduce the efficacy of the punch through stopper (PTS) layer protection described above.

In standby, the largest potential drop over the reverse-biased source/substrate and drain/substrate diodes equals the supply voltage $V_{dd}$. However, band-to-band tunneling is driven essentially by the electric field, which is the spatial gradient of the potential. That means that if the potential drop can be redistributed more evenly over the diode the band-to-band tunneling can be reduced.

In the embodiment of FIGS. 1 and 2, redistributing the potential drop is implemented by placing a layer 26 of $HfO_2$ (a high-k dielectric) adjacent to the n/p diode 34.

As can be seen in FIGS. 1 and 2, the layer 26 of high-k dielectric is adjacent to and extends along the lower portion 32 of the fin 12. The high-k dielectric layer 26 extends in a plane parallel to the fin 12. The high-k dielectric layer 26 surrounds the junction 34 between the upper portion 30 and the lower portion 32 of the fin 12. The high-k dielectric layer 26 also lies beneath the SiO.sub.2 of the STI trench 18 surrounding the lower portion 32 of the fin 12. The high-k dielectric layer 26 also extends in a plane parallel to the plane of the substrate 20. The high-k dielectric layer 26 forms a liner between the STI 18, the fin 12 and the substrate 20.

A high-k dielectric is an insulating material with a high dielectric constant in comparison to $SiO_2$ (k=3.9). Examples are silicon nitride (k=7.5) or $HfO_2$ (k>20). The effect of its high dielectric permeability is to force the electric field to penetrate through the high-k dielectric layer 26. As is explained in more detail later with reference to FIG. 6, the high-k dielectric layer 26 reduces the local electric field strength near the junction 34. This effect is known as the RESURF effect (reduced surface field). The RESURF effect lowers the local electric field strength across the junction 34, thereby reducing the effects of BTBT without requiring a reduction in doping levels.

Figure 3:
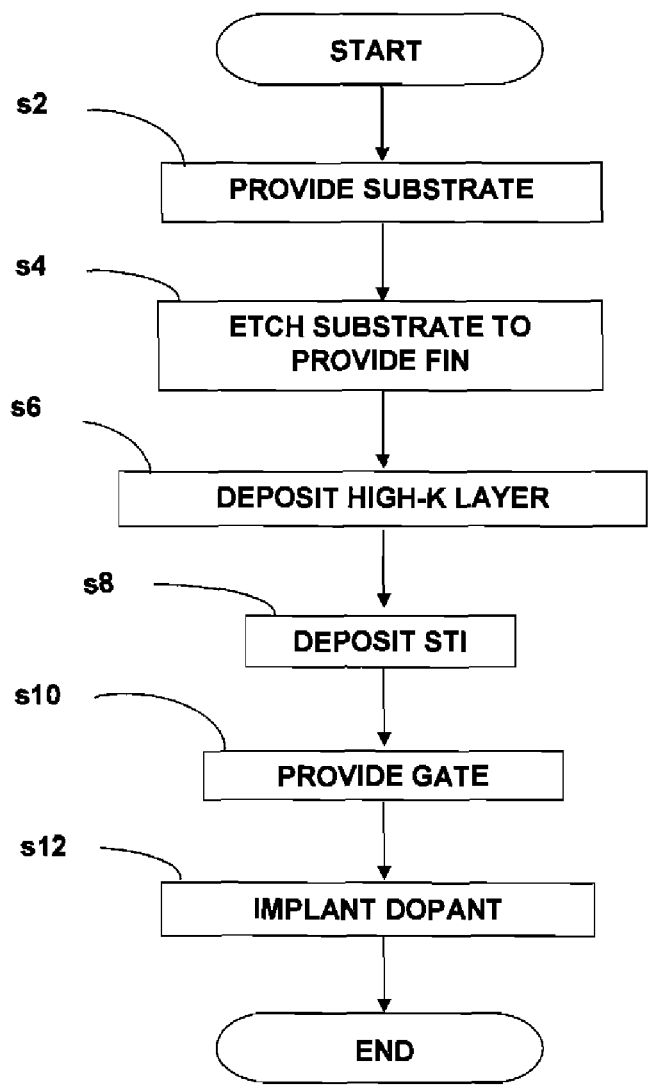
FIG. 3 is a schematic illustration of a method of fabrication of the FinFET illustrated in FIGS. 1 and 2.

FIG. 3 is a schematic illustration of a method of fabrication of the FinFET illustrated in FIGS. 1 and 2.

In step s2, the substrate 20 is provided. The substrate is a bulk Si wafer.

In step s4, the substrate 20 is etched to provide the fin portion 12 of the FinFET 100. The fin 12 is a rectangular shaped protrusion of semiconductor material extending perpendicularly to the plane of the substrate 20.

In step s6, the high-k dielectric layer 26 is deposited on top of the substrate 20 and on both sides of the fin 12 along the length of the fin 12 so that the high-k dielectric layer 26 is provided directly adjacent the fin 12 on opposite sides of the upper portion 30 of the fin 12. The high-k dielectric layer 26 is 10 nm thick. Particularly effective thicknesses for the high-k layer are thicknesses falling in the range of 5-10 nm on either side of the junction.

In step s8, the $SiO_2$ shallow trench isolation (STI) layer 18 is provided. The STI 18 is formed on top of the high-k layer 26 by depositing $SiO_2$ on areas either side of the fin 12 in a similar fabrication method as is used in conventional planar bulk CMOS fabrication. Once the STI 18 has been deposited on top of the high-k layer 26, it is planarized. Unlike in the planar bulk CMOS fabrication process, however, in this FinFET fabrication process, the STI is then etched back after planarization so that the side walls of the fin 12 are exposed.

The high-k dielectric layer 26 $HfO_2$ acts as a liner positioned between the STI 18 and the opposite sides of the upper portion 30 of the fin 12.

In step s10, the gate 22 is provided. Layers of dielectric, metal and polysilicon material are deposited on top of the STI 18 and across the top of and around the sides of the fin 12 and etched to form the gate 22 illustrated in FIG. 1.

In step s12, after gate etch, dopants are implanted in the fin 12 to form the active semiconductor areas. The source and drain regions 14, 16 are heavily doped by an ion implantation process using n-type dopants for NMOS and p-type for PMOS.

For the sake of simplicity, the step s12 of doping by ion implantation is explained as occurring after the step s10 of gate etch, since this is when the final heavy doping of the source and drain regions 14, 16 of the exposed upper portion 30 of the fin 12 typically takes place. As will now be explained, however, doping the different types of layers and regions may take place at various stages during fabrication.

For example, the source and drain are implanted after the gate has been formed, the gate acting as a mask for the channel region which should not receive the source/drain implant. The PTS is implanted before gate formation. The source/drain are implanted more shallowly, but with higher concentration.

The channel can be implanted before or after gate etch; in the latter case the channel will not be homogeneously doped (this is known as pockets or halos).

Typically the PTS profile starts directly below the active (top part) of the fin and extends between 40 and 100 nm downwards.

Various other implementation details are possible, as follows.

A WELL may be used. The well is meant to isolate transistors from each other and to isolate the source/drain from the substrate. An NMOS is made in a P-WELL, a PMOS is made in an N-WELL.

A VT-Adjust (VTA) may be used, and is intended to tune the threshold voltage.

The PTS is intended to prevent deep leakage between the source and the drain.

The HALO (=POCKET) is intended to make the VT less dependent on the gate length.

There are many different scenarios in which implantations are done at different steps in the process. The halo is always implanted after the gate is formed, the other three implementations discussed directly above are typically (but not necessarily) prior to that.

In a bulk FinFET normally only the WELL and the PTS are implanted, prior to gate deposition. The WELL has a low concentration (typically <1e17/cm$^3$) which is not enough to stop punch-through, the PTS has concentrations around 1e18/cm$^3$.

Various options are possible with regard to the timing and the implementation of the earlier mentioned planarizing actions, including the following three possibilities:

(i) the high-k layer is deposited to the level of the top of the fin and then subject to planarization before the STI layer is applied;

(ii) the STI layer and the high-k layer are etched back simultaneously to expose the upper portion of the fin; and (iii) the high-k layer is deposited only to the level that the STI layer will be at after etching, the STI then being deposited over the high-k layer, planarized and then etched back to the same height as the high-k layer.

Of the above, option (ii) is the easiest from a manufacturing point of view.

Returning to consideration of the total process, one particularly suitable example of the order of various doping and etching steps is the following sequence:
WELL
Fin etch
high-k and STI fill and etch back
PTS
Gate
source/drain.

Figure 4:
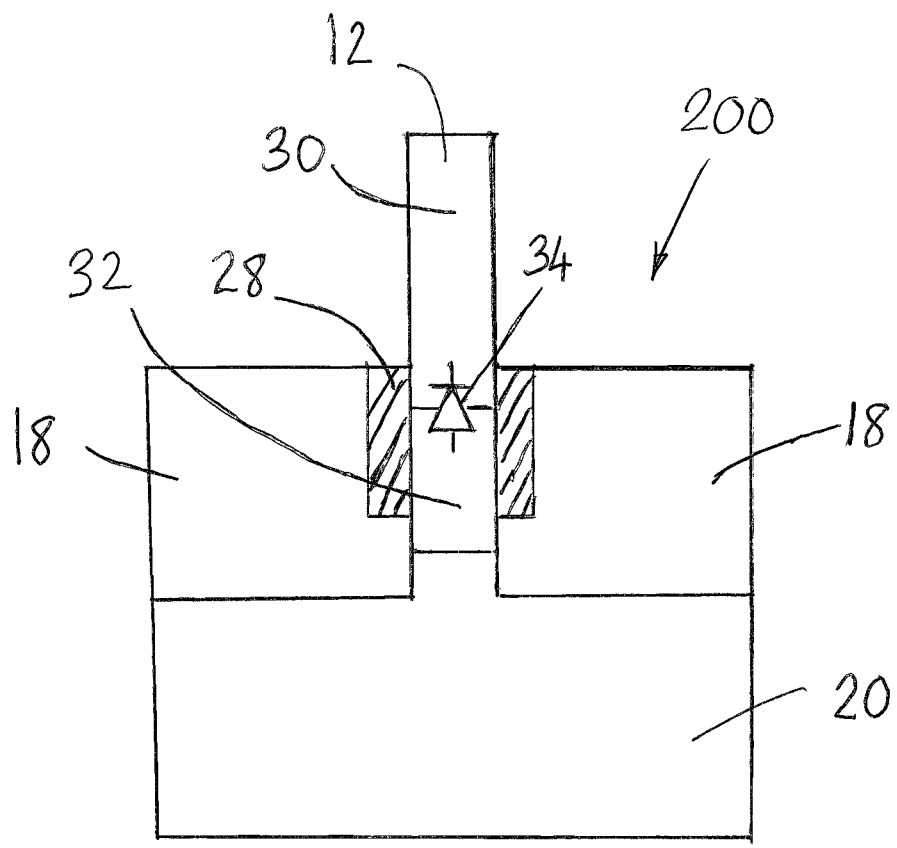
FIG. 4 is a schematic illustration (not to scale) of a cross-section taken through the fin outside the gate of a second embodiment of a FinFET.

FIG. 4 is a schematic illustration (not to scale) of a cross-section taken through the fin outside the gate i.e. through the source 14 or drain 16 of a second embodiment of a FinFET 200. Where features are the same as for the FinFET 100 of FIGS. 1 and 2, the same reference numerals have been used.

The fin 12 of the FinFET 200 of this embodiment is subdivided into an upper portion 30 and a lower portion 32. The upper portion 30 of the fin 12 forms the source and the drain regions 14, 16. The source and the drain regions 14, 16 are highly doped with n-type dopant (NMOS). The lower portion 32 of the fin is doped with a p-type punch-through stopper dopant implanted in the lower portion 32 of the fin 12 directly below the channel 24.

To prevent the abruptness of the junctions formed between the source and drain regions and the lower portion of the fin from leading to leakage currents formed by band-to-band tunneling (BTBT), a layer 28 of $HfO_2$ (i.e. a high-k dielectric layer) is placed adjacent to the n/p junction 34.

As can be seen in FIG. 4, the high-k dielectric layer 28 of is adjacent to and extends along the lower portion 32 of the fin 12. The high-k dielectric layer 28 extends in a plane parallel to the fin 12. The high-k dielectric layer 28 surrounds the junction 34 between the upper portion 30 and the lower portion 32 of the fin 12.

In contrast to the first embodiment, in this embodiment, the high-k dielectric layer 28 does not lie beneath the $SiO_2$ of the STI trench 18 surrounding the lower portion 32 of the fin 12. The high-k dielectric layer 28 does not extend in a plane parallel to the plane of the substrate 20. The high-k dielectric layer 28 does not extend to the top surface of the substrate 20. Thus in this embodiment, the high-k dielectric layer 28 surrounds the lower portion 32 of the fin 12 in the region of the n/p junction 34 only.

Figure 5:
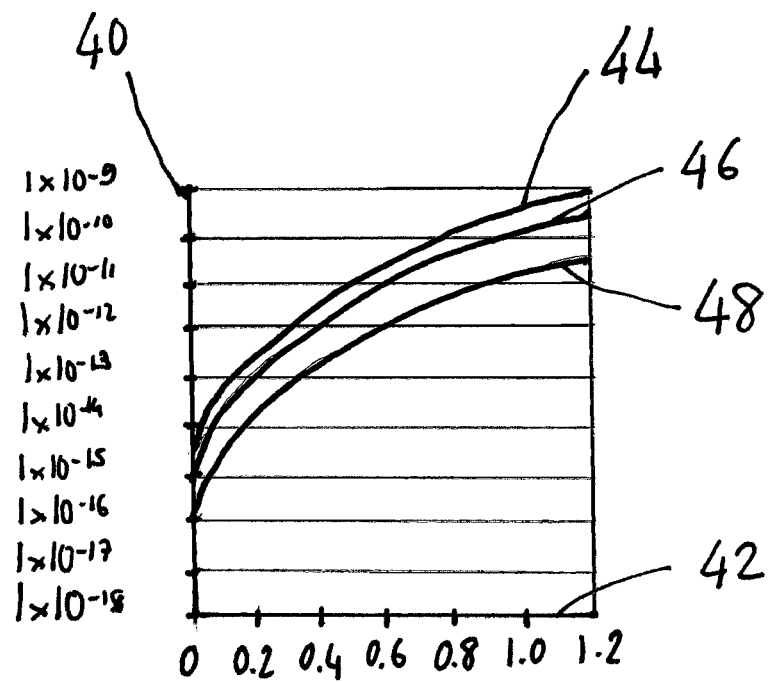
FIG. 5 is a schematic diagram of the simulated reverse bias diode characteristics for various FinFETs.

FIG. 5 is a schematic diagram of the simulated reverse bias diode characteristics for various FinFETs. The vertical axis 40 shows the leakage current $I_{leak}$ in arbitrary units.

The horizontal axis 42 shows the supply voltage $V_{dd}$, in Volts. Curve 46 shows the simulated diode characteristic for FinFET 200 shown in cross-section in FIG. 4, in which the high-k dielectric layer is $Si_3N_4$ (k=7.5). Curve 48 shows the simulated diode characteristic for a FinFET constructed in the same way as the FinFET 200 shown in cross-section in FIG. 4, but in which the dielectric is a material with a very high-k value (k=20). Curve 44 shows the simulated diode characteristic for a reference FinFET without a high-k dielectric layer.

Clearly, for supply voltages around 1V, for the 22 nm node, diode leakage can be reduced by approximately 1.5 orders of magnitude, i.e. by approximately a factor of 30, thanks to the RESURF effect caused by the high-k layer.

Figure 6:
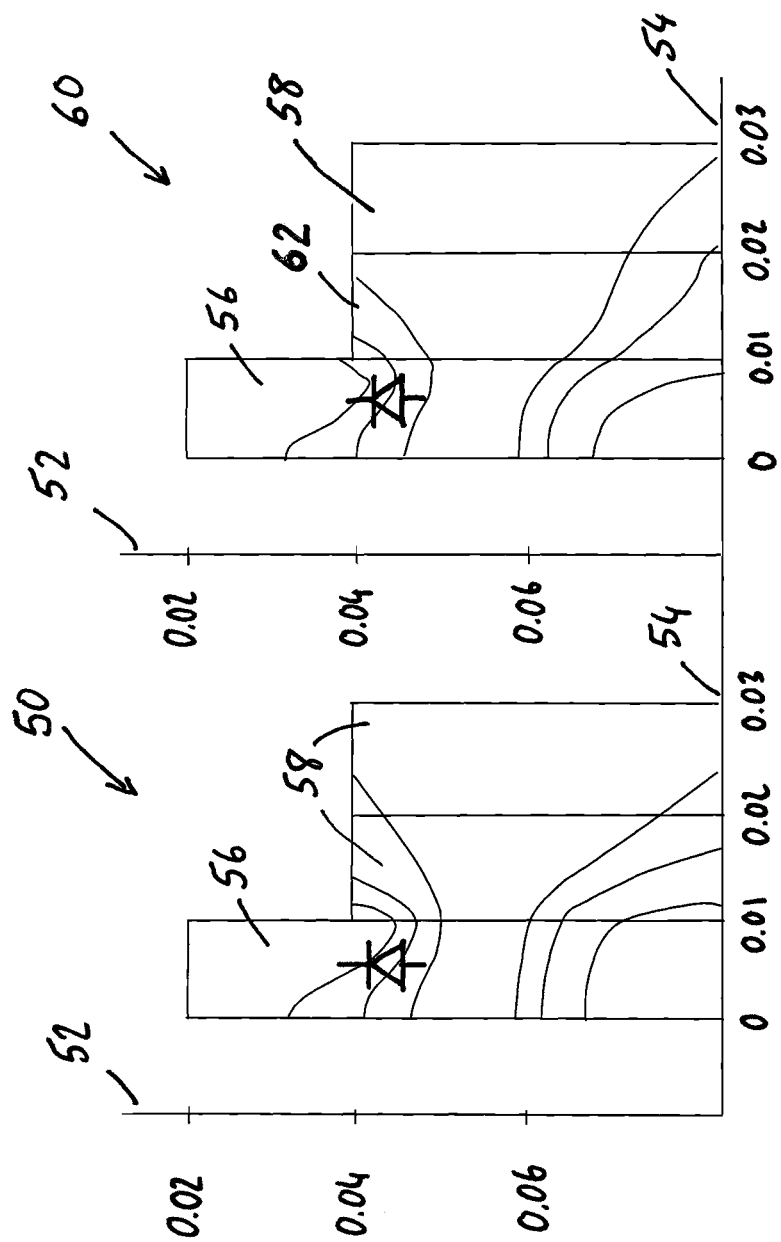
FIG. 6 is a schematic diagram demonstrating the RESURF effect around n/p diode junction for two FinFETs.

FIG. 6 is a schematic diagram demonstrating the RESURF effect around n/p diode junction for two FinFETs. For each FinFET only half of the symmetric structure is shown. The junction position is indicated by the diode symbol. The vertical axis 52 shows the vertical height Y of the FinFET in micrometers (μm). The horizontal axis 54 shows the horizontal distance X from the central axis of the fin 12 in micrometers (μm).

The left hand side of the diagram 50 depicts a standard FinFET with $SiO_2$ everywhere in the STI area, i.e. with no high-k dielectric layer. The right hand side of the diagram 60 shows a cross section of a FinFET with a high-k dielectric layer.

In both the left and the right hand side diagrams, the central portion 56 of the FinFETs is a silicon fin. In the left hand side diagram 50, the portions 58 of the FinFET adjacent the central portion 56 are $SiO_2$. In the right hand side diagram 60, the portion 62 of the FinFET adjacent the fin portion 56 is a 10 nm wide high-k dielectric layer or liner. The high-k insulating liner is adjacent to the p/n junction. The portion 58 of the FinFET adjacent the high-k dielectric layer 62 but further from the fin portion 56 is $SiO_2$.

The diagram shows the distribution of the iso-potential lines across each FinFET. It is clear from the diagrams that the iso-potential lines for the FinFET with high-k liner, as shown in the right hand FIG. 60, are distributed over a larger distance in the y-direction, demonstrating the RESURF effect.

Simulations show that a leakage improvement of between 10× to 100× can be achieved for all combinations of fin width between 10-30 nm, punch-through stopper (PTS) concentrations between $10^{18}$ and $10^{19}$ atom/$cm^3$ and source/drain doping levels around $10^{20}$ atom/$cm^3$. Also the mechanism of tunneling (whether direct tunneling or trap-assisted tunneling) plays no role in the obtainable improvement.

Figure 7:
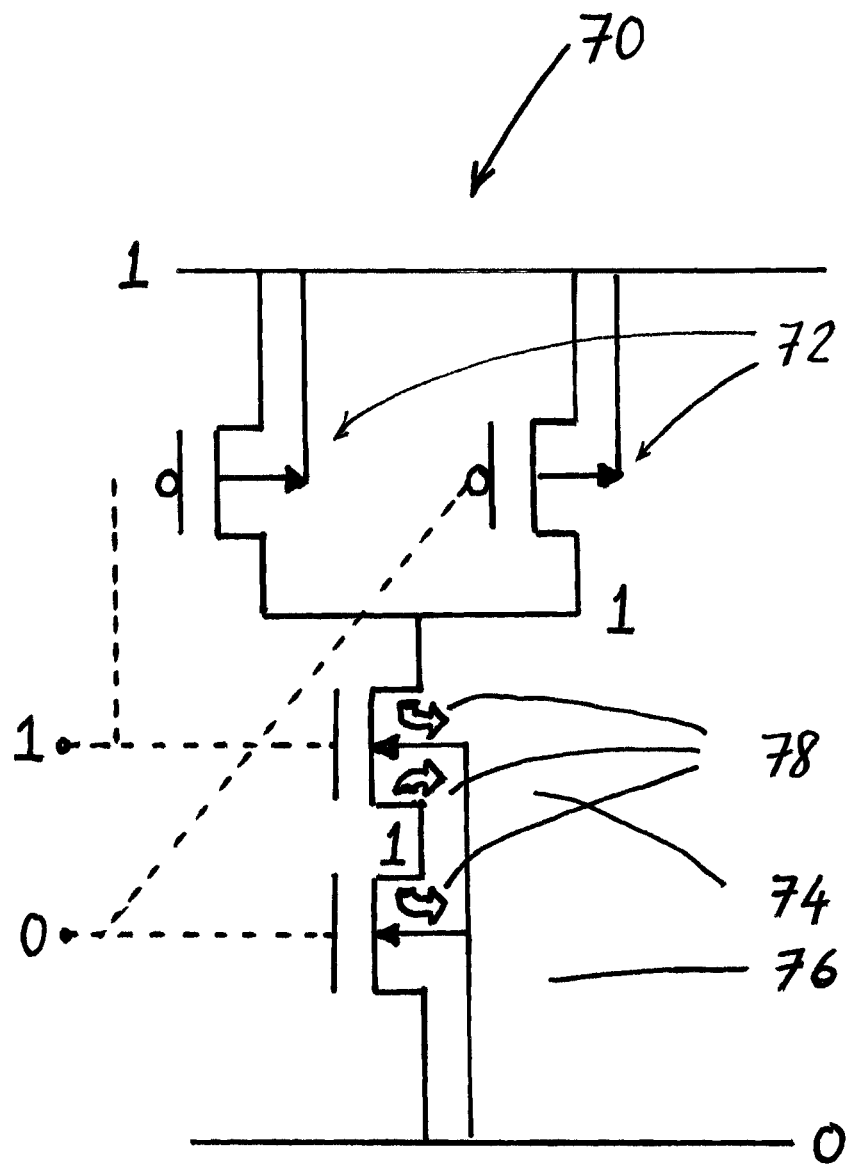
FIG. 7 is a schematic illustration of a 2-input NAND logic gate in CMOS technology which is illustrative of the possible advantages of the leakage reduction demonstrated in FIG. 5 on standard cell level.

FIG. 7 is a schematic illustration of a 2-input NAND logic gate 70 in CMOS technology which is illustrative of the possible advantages of the leakage reduction demonstrated in FIG. 5 on standard cell level.

In FIG. 7 two PMOS transistors 72 are connected in parallel, with their substrate contacts at the logical "1". Two NMOS transistors 74, 76 are connected in series with their substrate contacts at the logical "0". In the depicted state of the cell, three source/drain to substrate diodes are reverse-biased and leak to the substrate contact, as indicated by arrows 78. Thus, in the bias condition depicted in the 2-input NAND logic gate 70 shown in FIG. 7, three out of four NMOS source/drain to substrate diodes are reverse-biased and will contribute to the total leakage of the cell.

Note that the situation depicted in FIG. 7 is only illustrative. For other bias conditions other diodes will leak, and for any digital cell in CMOS technology, whether SRAM or logical, there are source/drain diodes which are reverse-biased, their leaking current contributing to and possibly dominating the total standby power consumption.

Figure 8:
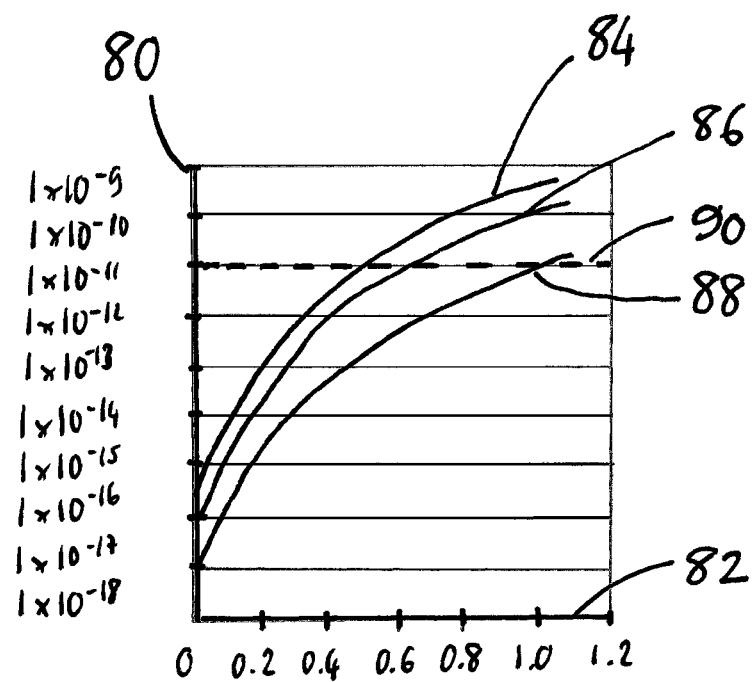
FIG. 8 is a full three-dimensional simulation of the total leakage current of the top NMOS transistor in FIG. 7, where a fin width of 15 nm, a typical value for the 22 nm node has been chosen.

FIG. 8 shows a full three-dimensional simulation of the total leakage current of the top NMOS transistor 74 in FIG. 7, where a fin width of 15 nm, a typical value for the 22 nm node, has been chosen.

The vertical axis 80 shows the leakage current $I_{leak}$ in Amps/μm.

The horizontal axis 82 shows the supply voltage $V_{dd}$, in Volts. Curve 86 shows the simulated diode characteristic for the top NMOS transistor 74 of FIG. 7, which has a 10 nm wide high-k dielectric layer of $Si_3N_4$ (k=7.5). Curve 88 shows the simulated diode characteristic for an NMOS transistor constructed in the same way as the top NMOS transistor 74 of FIG. 8 but with a very high-k dielectric liner (k=20). Curve 84 shows the simulated diode characteristic for the reference case of an NMOS transistor without a liner along the vertical source/drain to substrate diodes.

The leakage current $I_{leak}$ is normalized to the effective width of the FinFET ($W_{eff}=2H_{fin}+W_{fin}$), where $W_{eff}$ is the effective width of the fin, $H_{fin}$ is the height of the fin, and $W_{fin}$ is the width of the fin. The low-power leakage target is indicated for the 22 nm node.

Again the graph demonstrates that the high-k liner reduces transistor leakage by about 1.5 order of magnitude, but what is even more important is that the normalized (to the total effective width of the FinFET) leakage can be reduced to below 10 pA/µm, which, as shown in FIG. 8, is the LP leakage target specification 90 for the low-standby power (LP) technology. In other words, the invention may facilitate the use of bulk FinFETs for low-power applications.

Although in the above embodiments the substrate 20 has been described as silicon, the substrate 20 can be any suitable substrate material compatible with integrated circuit fabrication processes on bulk planar wafers. Similarly, although the STI 18 has been described as comprising $SiO_2$, the STI can be any suitable isolation material compatible with integrated circuit fabrication processes on bulk planar wafers.

Although the fin 12 has been described as rectangular shaped, the fin may also have other shapes. For example the fin may have slightly rounded top corners. The fin 12 can also be slightly tapered reducing in width towards the bottom. The fin 12 has been described as extending 20 nm above the STI 18 and as being 20 nm wide. The fin can be of different widths and heights as desired for the particular application. A typical range for the fin width is 10-30 nm.

Although the figures show a tilted source-drain implementation in which the n/p junction 34 is located slightly below the STI 18 surface, FinFETs with n/p junctions located higher or lower in the fin 12 are also envisaged.

The embodiments have been described with reference to NMOS devices. However, the invention is equally applicable to PMOS devices. Thus although the source and drain regions 14, 16 have been described as being heavily doped with n type dopants, they could also be doped with p-type dopants.

Whilst the high-k layer 26, 28 has been explained as being comprised of $HfO_2$, (for which k=21), the high-k dielectric material may be any insulator compatible with CMOS fabrication technologies with a higher dielectric constant k than that of $SiO_2$. For example, another suitable material is $Si_3N_4$ (for which k=7.5). More generally, any material with a k value higher than that of $SiO_2$, i.e. k=3.9, may be used. For example, a k-value of k=5 may be used, to provide redistribution of the potential drop across the diode etc., to at least some extent, even though higher values such as, for example, k=7.5 (for $Si_3N_4$) and k=21 for $HfO_2$, will tend to provide an even larger improvement. k=21 is the k-value of bulk $HfO_2$, although deposited layers may sometimes have values differing slightly therefrom. Generally, k-values of k≥20 are particularly advantageous. Examples of other possible materials for the high-k dielectric layer include HfSiO, $ZrO_2$, ZrSiO, and $SrTiO_3$.

Although the high-k dielectric layers 26, 28 have been described as being located on both side faces of the fin adjacent the junctions, it is also possible to place the high-k layer only on one side of the fin.

In the embodiment illustrated in FIGS. 1 and 2, the layer of high-k dielectric material lies beneath the full extent of the $SiO_2$ of the STI trench and completely surrounds the lower portion of the fin 12. It is also envisaged, however, that the layer of high-k dielectric material could extend only partially under the $SiO_2$ of the STI trench. Alternatively, the layer of high-k dielectric could extend only along part of the length of the fin 12 adjacent the p/n junction 34. Furthermore, it is also envisaged that the layer of high-k dielectric material could also extend above of the surface of the STI trench, partly to cover the upper portion of the fin.

Whilst the high-k layer 26, 28 has been described as being 5-10 nm thick, it is also possible for the layer to be thicker or thinner according to the desired application.

Although the leakage current has been described as being reduced by a factor of 30, according to the type and form of dielectric layer, the leakage current may be reduced by a factor of between 10 and 100.

Whilst the above embodiments are devices with 32 nm node CMOS fabrication, and the invention is particularly suited to 32 nm and beyond technology, nevertheless the invention is also applicable to other node specifications, for example 22 nm node fabrication.

In terms of fabrication, although the step of providing the fin has been described as by etching, any other suitable methods of providing the fin, such as by machining, could be used.

Additionally, the step of providing the high-k dielectric layer has been described as by depositing, any suitable way of providing a layer between the fin and the STI on one or two opposite sides of the fin could be used.

Similarly the STI layer and the gate may be provided by any suitable method, such as deposition or coating. The high-k dielectric layer may be planarized before the STI is planarized or at the same time. The STI may be etched back after planarization before the high-k dielectric layer is etched back so that the side walls of the fin are exposed or at the same time.

The gate may be provided by any suitable method such as deposition and etching or stacking.

Whilst the step of doping has been explained as occurring after the gate stacking and etching, various doping stages may take place earlier. For example, the p-type ion implantation to form the punch through stopper (PTS) may take place before the deposition of the k-type dielectric.

Other doping steps, such as forming a well of p-type silicon under the PTS layer, may also take place before the gate etch.

Typical concentrations of dopants may be: source/drain 14, 16: $10^{20}$ atom/cm$^3$; channel region 24: $<10^{17}$ atom/cm$^3$; punch-through stopper (not shown): $10^{18}$-$10^{19}$ atom/cm$^3$; well (not shown): $10^{16}$-$10^{17}$ atom/cm$^3$.

Other doping concentrations may also be selected according to the desired application.

It should be noted that terminology such as top, over, above, under, below vertical, horizontal are used throughout the description, for the purpose of explaining the relative positions of the features of the present invention. These terms are not intended to limit the orientation of the device.

The invention claimed is:

1. A fin field effect transistor (FinFET) comprising:
    a semiconductor substrate;
    a fin having an upper portion and a lower portion, the upper portion being doped with a dopant of a first conductivity type, the lower portion being doped with a dopant of a second conductivity type,
    wherein the junction between the upper portion and the lower portion acts as a diode;
    one or more shallow trench isolation layers (STI) adjacent the fin, wherein the junction is lower than an upper surface of the shallow trench isolation layers;
    at least one layer of high-k dielectric material between the shallow trench isolation layer and the fin and at least partially between the shallow trench isolation layer and the semiconductor substrate, wherein a portion of the high-k dielectric material lies beneath the shallow trench isolation layers surrounding the lower portion of the fin.

2. The FinFET according to claim 1, wherein the at least one layer of high-k dielectric material has a k value of k≥5.

3. The FinFET according to claim 1, wherein the at least one layer of high-k dielectric material has a k value of k≥7.5.

4. The FinFET according to claim 1, wherein the at least one layer of high-k dielectric material has a k value of k≥20.

5. The FinFET according to claim 4, wherein the at least one layer of high-k dielectric material is $HfO_2$.

6. The FinFET according to claim 1, wherein the at least one layer of high-k dielectric material adjacent at least one side of the fin comprises a layer of dielectric material provided adjacent opposite sides of the fin.

7. The FinFET according to claim 1, wherein the fin further comprises a source and a drain separated by a channel region, the channel region of the fin-being surrounded by a gate region on three sides.

8. FinFET according to claim 7, wherein the FinFET further comprises a punch through stopper layer provided in the lower portion of the fin below the channel region.

9. A method of fabricating a FinFET, the method comprising the steps of:
provide (s2) a semiconductor substrate;
etching (s4) the substrate to provide a fin;
depositing (s6) a layer of high-k dielectric material adjacent at least one side of the fin;
depositing (s8) a shallow trench isolation layer above the substrate and adjacent the layer of high-k dielectric material, wherein at least one layer of high-k dielectric material is between the shallow trench isolation layer and the fin and at least partially between the shallow trench isolation layer and the semiconductor substrate, wherein a portion of the high-k dielectric material lies beneath the shallow trench isolation layer surrounding the lower portion of the fin;
providing (s10) a gate region on top of and around the sides of the fin; and
implanting dopants (s12) in the fin to form the active semiconductor areas, wherein the step of implanting dopants (s12) comprises heavily doping an upper portion and a lower portion of the fin, the upper portion being doped with a dopant of a first conductivity type, the lower portion being doped with a dopant of a second conductivity type, wherein the junction between the upper portion and the lower portion acts as a diode, wherein the junction is lower than an upper surface of the shallow trench isolation layers.

10. The method of fabricating a FinFET according to claim 9, wherein the step of depositing (s6) a layer of high-k material comprises depositing (s6) at least one layer of high-k dielectric material adjacent at least one side of the fin for redistributing a potential drop more evenly over the diode, compared to if the at least one layer of high-k dielectric material were not present, when the upper portion is connected to a first potential and the lower portion is connected to a second potential thereby providing the potential drop across the junction.

11. The method of fabricating a FinFET according to claim 9, wherein the step of depositing (s6) a layer of high-k dielectric material comprises depositing a layer of high-k dielectric material with a k value of $k \geq 5$.

12. The method of fabricating a FinFET according to claim 9, wherein the step of depositing (s6) a layer of high-k dielectric material comprises depositing a layer of high-k dielectric material with a k value of $k \geq 7.5$.

13. The method of fabricating a FinFET according to claim 9, wherein the step of depositing (s6) a layer of high-k dielectric material comprises depositing a layer of high-k dielectric material with a k value of $k \geq 20$.

14. The method of fabricating a FinFET according to any of claim 9, wherein the step of depositing (s6) a layer of high-k dielectric material adjacent at least one side of the fin comprises depositing (s6) a layer of high-k dielectric material adjacent opposite sides of the fin.

* * * * *